US007889411B2

(12) United States Patent
Latypov

(10) Patent No.: US 7,889,411 B2
(45) Date of Patent: Feb. 15, 2011

(54) SYSTEM AND METHOD FOR CALCULATING AERIAL IMAGE OF A SPATIAL LIGHT MODULATOR

(75) Inventor: Azat M. Latypov, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 364 days.

(21) Appl. No.: 12/125,844

(22) Filed: May 22, 2008

(65) Prior Publication Data

US 2008/0219562 A1     Sep. 11, 2008

Related U.S. Application Data

(63) Continuation of application No. 11/169,587, filed on Jun. 30, 2005, now Pat. No. 7,394,584, which is a continuation of application No. 10/835,403, filed on Apr. 30, 2004, now Pat. No. 6,963,434.

(51) Int. Cl.
    *G02B 26/00*     (2006.01)
(52) U.S. Cl. .................. 359/237; 359/290; 359/296; 356/497; 382/206; 250/492.2; 347/239
(58) Field of Classification Search .......... 359/237–239, 359/290, 291, 298, 3, 11, 21, 24, 32, 33, 359/559, 573, 578; 356/458, 484, 495–497, 356/509, 511, 512, 520; 382/190, 211; 365/216
See application file for complete search history.

(56) References Cited

U.S. PATENT DOCUMENTS

| 5,083,015 A | 1/1992 | Witthoft et al. |
| 5,229,872 A | 7/1993 | Mumola |
| 5,296,891 A | 3/1994 | Vogt et al. |
| 5,402,234 A * | 3/1995 | Deck .......................... 356/497 |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |

(Continued)

FOREIGN PATENT DOCUMENTS

EP     0 844 529 A2     5/1998

(Continued)

*Primary Examiner*—Loha Ben
(74) *Attorney, Agent, or Firm*—Sterne, Kessler, Goldstein & Fox P.L.L.C

(57) ABSTRACT

A method of calculating an aerial image of a spatial light modulator array includes calculating pair-wise interference between pixels of the spatial light modulator array; calculating effective graytones corresponding to modulation states of the pixels; and calculating the aerial image based on the pair-wise interference and the effective graytones. The graytones depend only on the modulation states of the pixels. The pair-wise interference depends only on position variables. The position variables are position in an image plane and position in a plane of a source of electromagnetic radiation. The pair-wise interference can be represented by a matrix of functions. The pair-wise interference can be represented by a four dimensional matrix. The effective graytones are approximated using sinc functions, or using polynomial functions.

20 Claims, 10 Drawing Sheets

U.S. PATENT DOCUMENTS

| | | |
|---|---|---|
| 6,177,980 B1 | 1/2001 | Johnson |
| 6,433,874 B2 | 8/2002 | Lindsay et al. |
| 6,445,470 B1 * | 9/2002 | Jenkins et al. ............... 359/11 |
| 6,522,983 B1 | 2/2003 | Dobos et al. |
| 6,624,893 B1 * | 9/2003 | Schmit et al. ............... 356/511 |
| 6,687,041 B1 | 2/2004 | Sandstrom |
| 6,747,783 B1 | 6/2004 | Sandstrom |
| 6,775,049 B1 | 8/2004 | So |
| 6,795,169 B2 | 9/2004 | Tanaka et al. |
| 6,804,429 B2 | 10/2004 | Yu et al. |
| 6,806,897 B2 | 10/2004 | Kataoka et al. |
| 6,811,953 B2 | 11/2004 | Hatada et al. |
| 6,833,854 B1 * | 12/2004 | Sandstrom ................. 347/239 |
| 6,847,461 B1 * | 1/2005 | Latypov et al. ............. 356/520 |
| 6,963,434 B1 | 11/2005 | Latypov |
| 6,965,436 B2 * | 11/2005 | Latypov et al. ............. 356/520 |
| 7,158,238 B2 * | 1/2007 | Latypov et al. ............. 356/520 |
| 7,394,584 B2 | 7/2008 | Latypov |
| 7,755,657 B2 * | 7/2010 | Sandstrom et al. .......... 347/239 |
| 2002/0122237 A1 | 9/2002 | Sandstrom et al. |
| 2004/0041104 A1 | 3/2004 | Liebregts et al. |
| 2004/0053143 A1 | 3/2004 | Sandstrom |
| 2004/0130561 A1 | 7/2004 | Jain |
| 2005/0007572 A1 | 1/2005 | George et al. |

FOREIGN PATENT DOCUMENTS

| | | |
|---|---|---|
| EP | 0 844 529 A3 | 5/1998 |
| WO | WO 98/33096 A1 | 7/1998 |
| WO | WO 98/38597 A2 | 9/1998 |
| WO | WO 03/052516 A1 | 6/2003 |

* cited by examiner

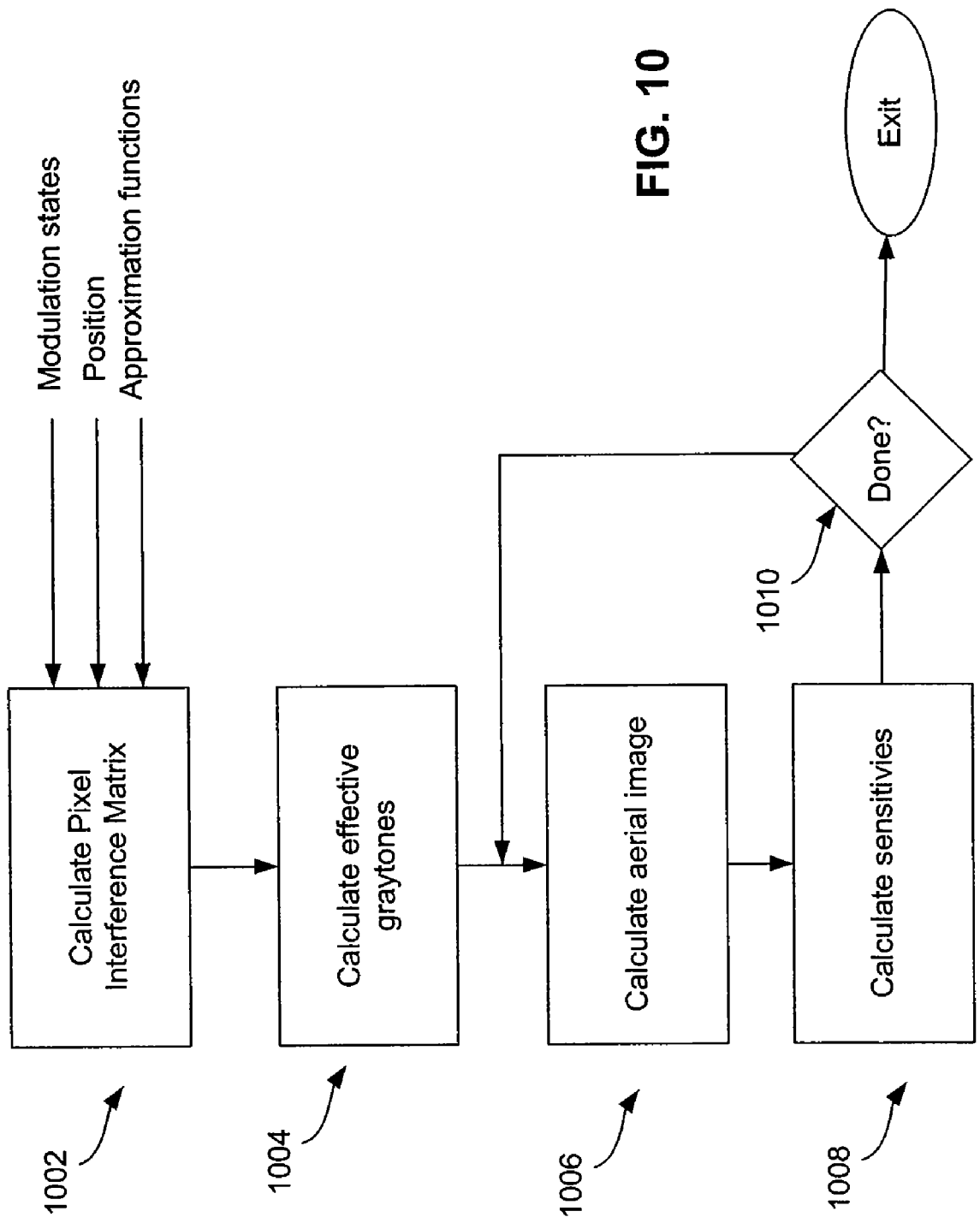

SYSTEM AND METHOD FOR CALCULATING AERIAL IMAGE OF A SPATIAL LIGHT MODULATOR

CROSS-REFERENCE TO RELATED APPLICATIONS

This application is a continuation of U.S. patent application Ser. No. 11/169,587, filed Jun. 30, 2005, entitled "System and Method for Calculating Aerial Image of a Spatial Light Modulator, now U.S. Pat. No. 7,394,584, which application is a continuation of U.S. patent application Ser. No. 10/835,403, filed on Apr. 30, 2004, entitled "System and Method for Calculating Aerial Image of a Spatial Light Modulator," now U.S. Pat. No. 6,963,434. Each of the foregoing applications is incorporated by reference herein in its entirety.

BACKGROUND OF THE INVENTION

1. Field of the Invention

The present invention relates generally to lithography. More particularly, the present invention relates to real-time calculations of an aerial image of a spatial light modulator (SLM) array.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semi-conductive, or insulative layers. This process is then repeated, together with other steps, until the desired features have been formed on the surface, or in various layers, of the wafer.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles are required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively expensive.

In order to overcome these drawbacks, maskless (e.g., direct write, digital, etc.) lithography systems have been developed. The maskless system replaces a reticle with a variable contrast device called a spatial light modulator (SLM). Known SLMs include a digital mirror device (DMD), a liquid crystal display (LCD), a grating light valves device (GLV), or the like. The SLM includes an array of active areas (e.g., tilting and/or pistoning mirrors or greytoning LCD array cells) that vary optical properties in a controlled fashion to form a desired pattern.

At the same time, there is a need in the industry for real-time calculation of aerial images (i.e., images in the focus plane of the projection optics), and (the reverse of that process) the calculation of the state of the pixels required to produce such an image. Typically the latter calculation is done iteratively. Knowing the intensity distribution desired at the image plane, the SLM controller, or a computer system connected to the SLM controller, needs to calculate the optimum set of pixel modulation inputs to produce the desired intensity distribution at the image plane. However, conventional "brute force" approaches to such calculations are extremely computationally intensive, which usually makes it impossible to continuously re-compute the aerial images in real time.

Accordingly, what is needed is a method and system for rapid calculation of aerial images.

SUMMARY OF THE INVENTION

The present invention is directed to a system and method for calculating aerial image a spatial light modulator that substantially obviates one or more of the problems and disadvantages of the related art.

One embodiment of the present invention includes a method of calculating an aerial image of a spatial light modulator array that includes the steps of calculating pair-wise interference between pixels of the spatial light modulator array; calculating effective graytones corresponding to modulation states of the pixels; and calculating the aerial image based on the pair-wise interference and the effective graytones. The graytones can depend only on the modulation states of the pixels. The pair-wise interference typically depends only on position variables, the modulation principle of the SLM pixel and the illumination mode. The position variables are position in an image plane and position in a plane of a source of electromagnetic radiation. The pair-wise interference can be represented by a matrix of functions, or a four dimensional matrix. For example, the effective graytones are approximated using sinc functions, or using polynomial functions.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and together with the description serve to explain the principles of the invention. In the drawings:

FIG. 10 illustrates a process of calculating the aerial image in flow chart form according to one embodiment of the present invention.

DETAILED DESCRIPTION OF EMBODIMENTS OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
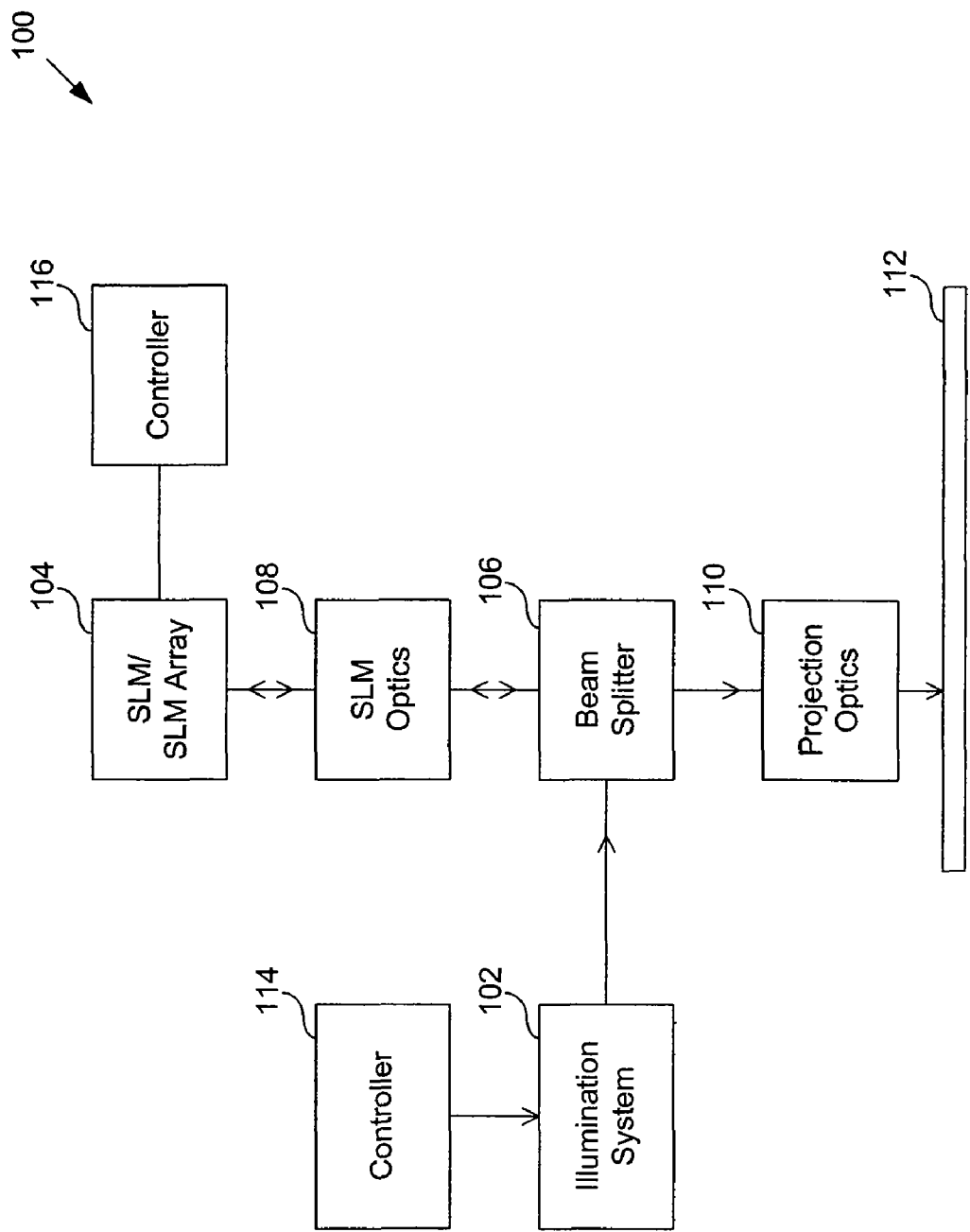
FIG. 1 shows a maskless lithography system having reflective spatial light modulators.

FIG. 1 shows a maskless lithography system 100 according to an embodiment of the present invention. System 100 includes an illumination system 102 that transmits light to a reflective spatial light modulator (SLM) 104 (e.g., a digital micromirror device (DMD), a reflective liquid crystal display (LCD), or the like) via a beam splitter 106 and SLM optics 108. SLM 104 is used to pattern the light in place of a reticle used in traditional lithography systems. Patterned light reflected from SLM 104 is passed back through beam splitter 106, then through projection optics (PO) 110 and is used to create an image of a circuit pattern on an object 112 (e.g., a substrate, a semiconductor wafer, a glass substrate for a flat panel display, or the like).

It is to be appreciated that illumination optics can be housed within illumination system 102, as is known in the relevant art. It is also to be appreciated that SLM optics 108 and projection optics 110 can include any combination of optical elements required to direct light onto desired areas of SLM 104 and/or object 112, as is known in the relevant art.

In alternative embodiments, either one or both of illumination system 102 and SLM 104 can be coupled to or have integral controllers 114 and 116, respectively. Controller 114 can be used to adjust illumination source 102 based on feedback from system 100 or to perform calibration. Controller 116 can also be used for adjustment and/or calibration. Alternatively, controller 116 can be used for controlling active devices (e.g., pixels, mirrors, locations, etc.) 302 (see FIG. 3, discussed below) on SLM 104, to generate a pattern used to expose object 112. Controller 116 can either have integral storage or be coupled to a storage element (not shown) with predetermined information and/or algorithms used to generate the pattern or patterns.

Figure 2:
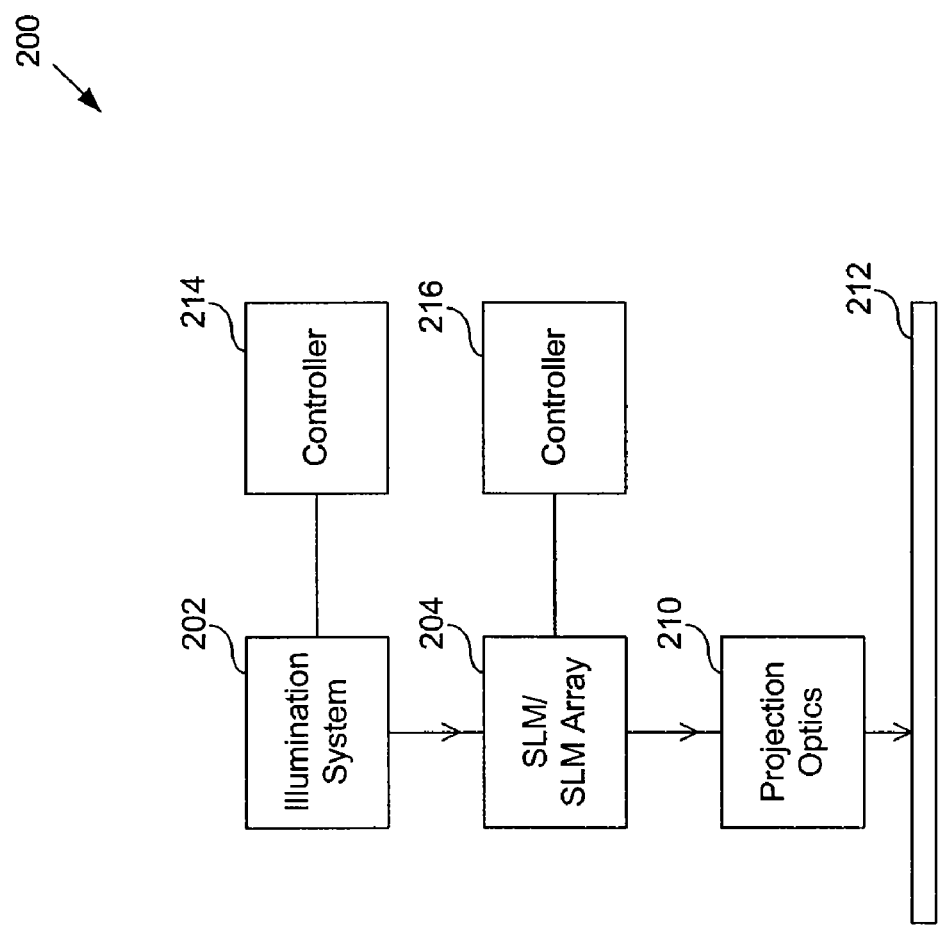
FIG. 2 shows a maskless lithography system having transmissive spatial light modulators.

FIG. 2 shows a maskless lithography system 200 according to a further embodiment of the present invention. System 200 includes an illumination source 202 that transmits light through a SLM 204 (e.g., a transmissive LCD, or the like) to pattern the light. The patterned light is transmitted through projection optics 210 to write the pattern on a surface of an object 212. In this embodiment, SLM 204 is a transmissive SLM, such as a liquid crystal display, or the like. Similar to above, either one or both of illumination source 202 and SLM 204 can be coupled to or integral with controllers 214 and 216, respectively. Controllers 214 and 216 can perform similar functions as controller 114 and 116 described above, and as known in the art.

Example SLMs that can be used in systems 100 or 200 are manufactured by Fraunhofer Institute for Circuits and Systems of Germany. A grating light valve (GLV) SLM, such as manufactured by Silicon Light Machines, of Sunnyvale, Calif., is another example of an SLM where the present invention is applicable.

Merely for convenience, reference will be made only to system 100 below. However, all concepts discussed below can also apply to system 200, as would be known to someone skilled in the relevant arts. The present invention is applicable to such systems as well.

Figure 3:
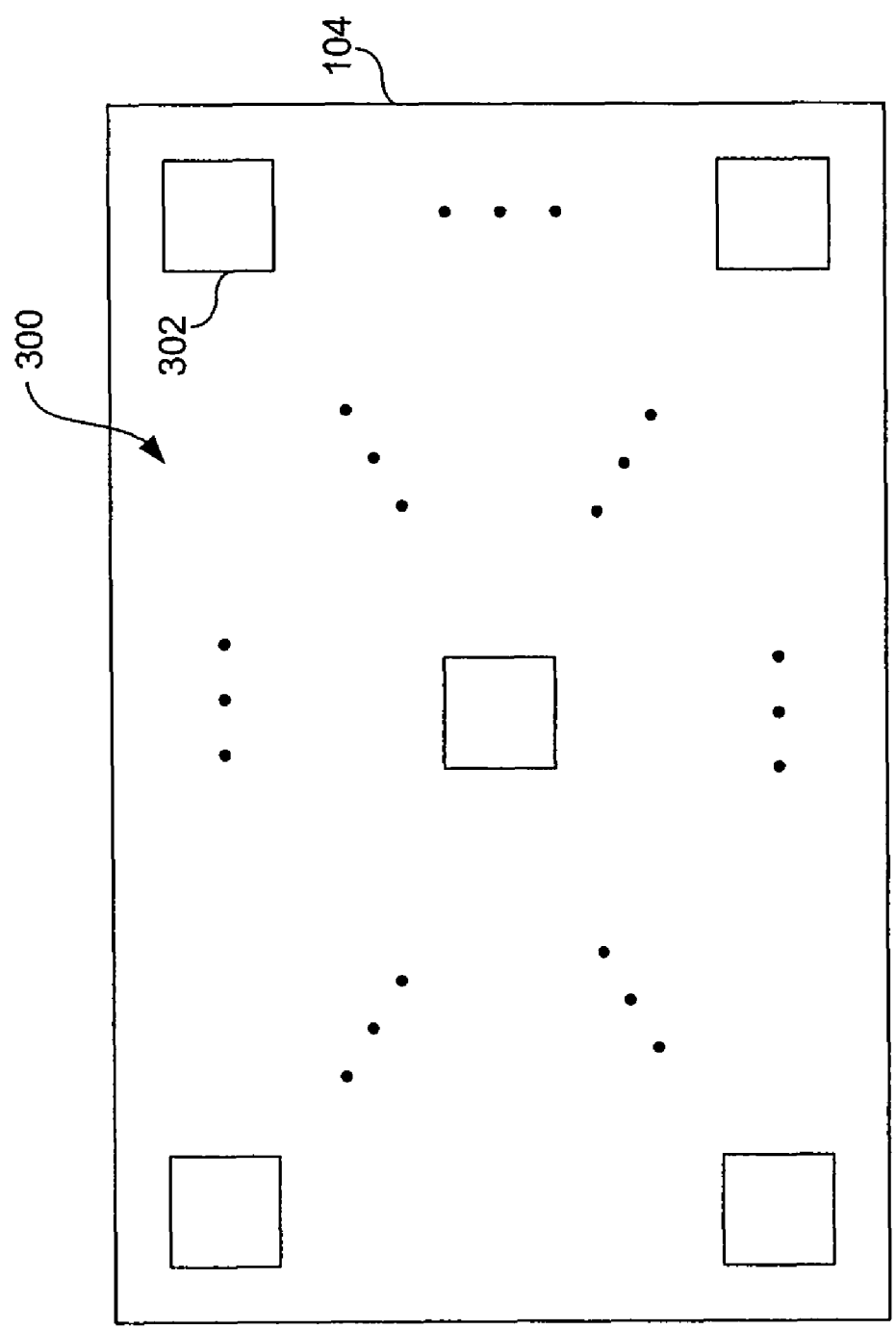
FIG. 3 shows another illustration of a spatial light modulator according to an embodiment of the present invention.

FIG. 3 shows details of an active area 300 of SLM 104. Active area 300 includes an array of active devices 302 (represented by dotted patterns in the figure). Active devices 302 can be mirrors on a DMD or locations on a LCD. It is to be appreciated that active devices 302 can also be referred to as pixels, as is known in the relevant art. By adjusting the physical characteristics of active devices 302, they can be seen as being either ON or OFF (for a binary SLM) or a state in-between ON and OFF for other SLMs. Digital or analog input signals based on a desired pattern are used to control various active devices 302. In some embodiments, an actual pattern being written to object 112 can be detected and a determination can be made whether the pattern is outside an acceptable tolerance. If so, controller 116 can be used to generate analog or digital control signals in real time to fine-tune (e.g., calibrate, adjust, etc.) the pattern being generated by SLM 104.

Figure 4:
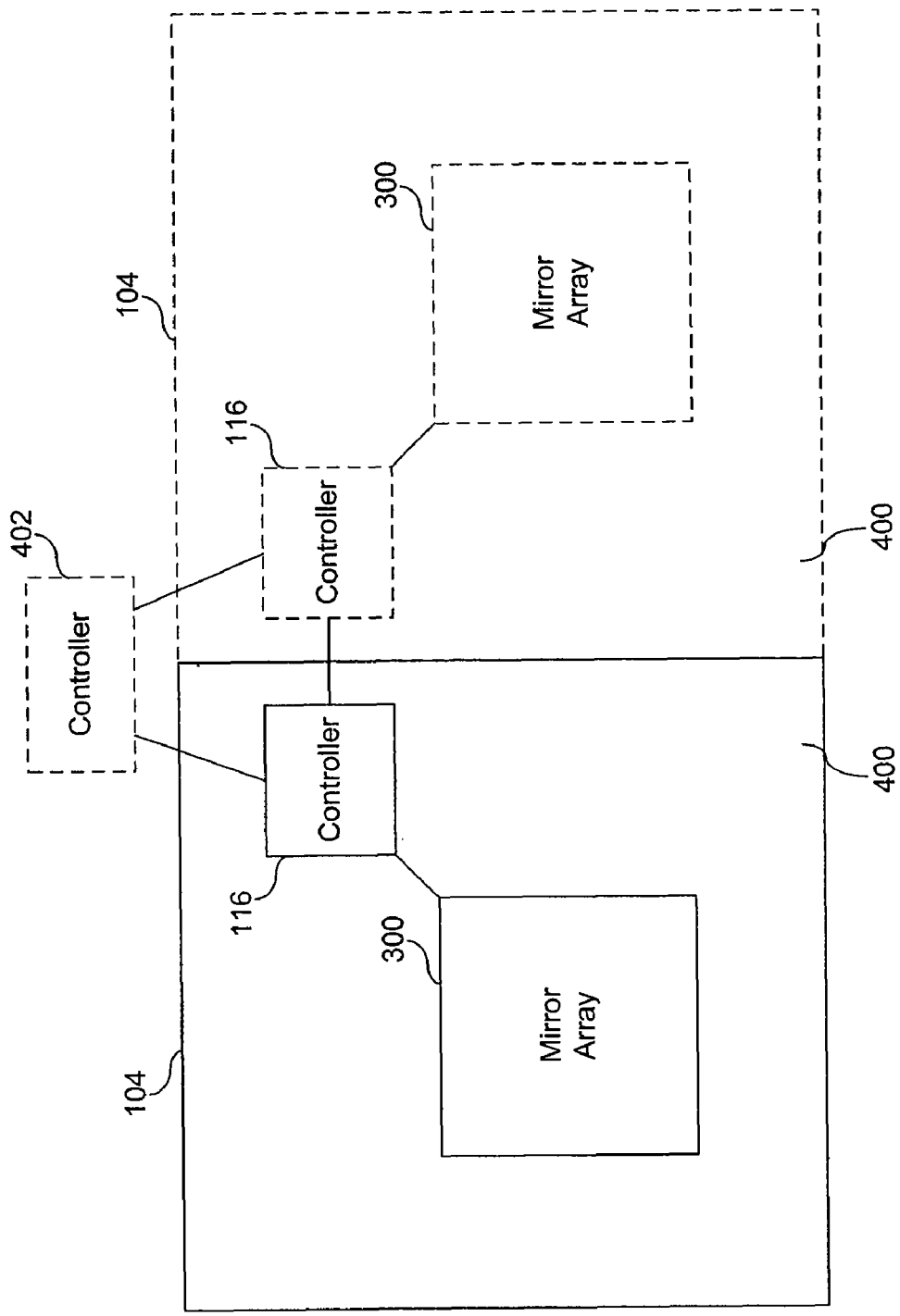
FIG. 4 shows more details of the spatial light modulator of FIG. 3.

FIG. 4 illustrates further details of SLM 104. SLM 104 can include an inactive packaging 400 surrounding active area 300. Also, in an alternative embodiment, a main controller 402 can be coupled to each SLM controller 116 to monitor and control an array of SLMs, as discussed below. Also discussed below, adjacent SLMs may be offset or staggered with respect to each other in other embodiments.

Figure 5:
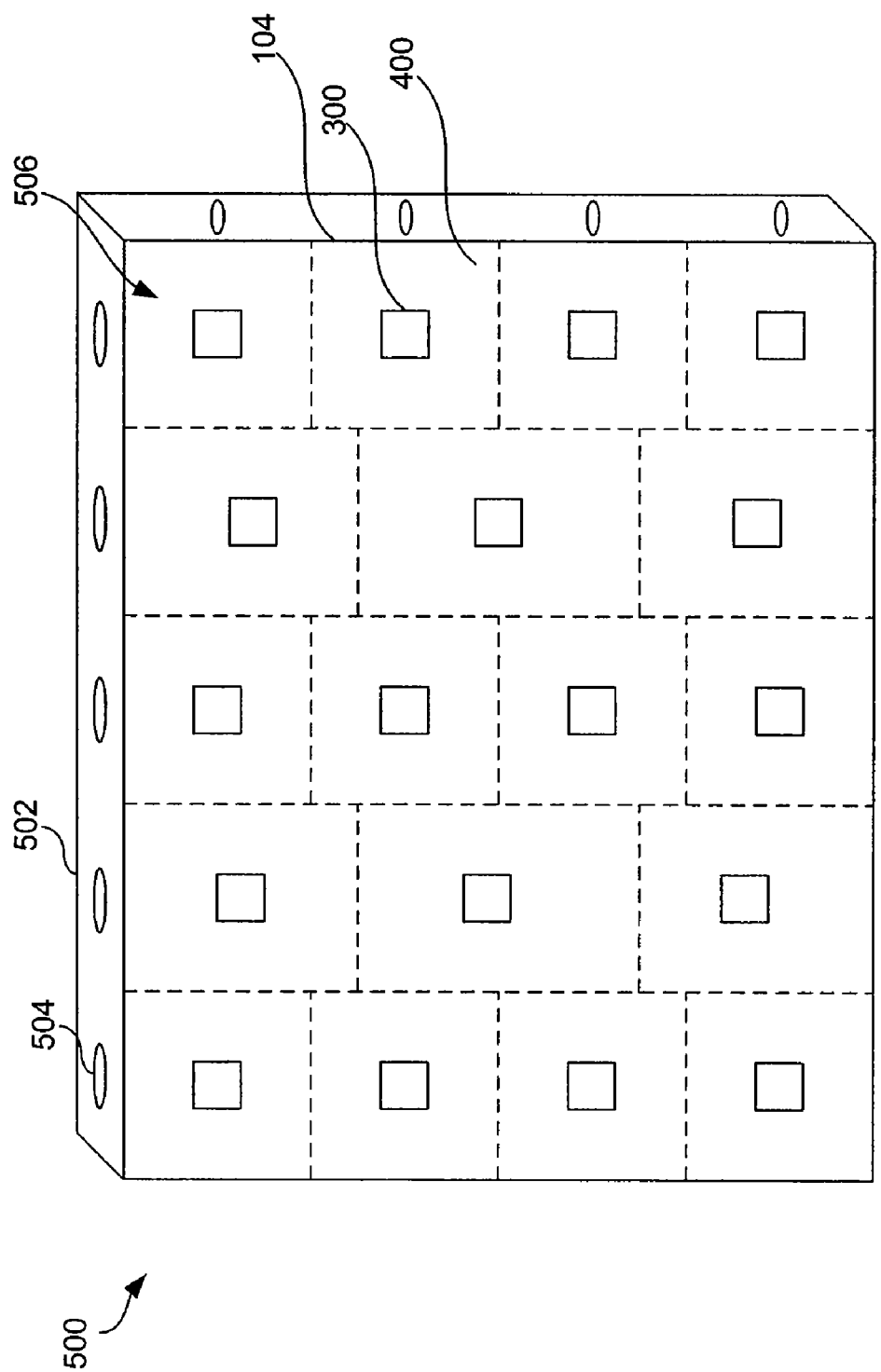
FIG. 5 shows a two-dimensional array of the spatial light modulator according to one embodiment of the present invention.

FIG. 5 shows an assembly 500 including a support device 502 that receives an array of SLMs 104. In various embodiments, as described in more detail below, the array of SLMs 104 can have varying numbers of columns, rows, SLMs per column, SLMs per row, etc., based on a number of desired exposures per pulse, or other criteria of a user. The SLMs 104 can be coupled to a support device 502. Support device 502 can have thermal control areas 504 (e.g., water or air channels, etc.), areas for control logic and related circuitry (e.g., see FIG. 4 showing elements 116 and element 402, which can be ASICs, A/D converters, D/A converters, fiber optics for streaming data, etc.), and windows 506 (formed within the dashed shapes) that receive SLMs 104, as is known in the relevant art. Support device 502, SLMs 104, and all peripheral cooling or control devices are referred to as an assembly. Assembly 500 can allow for a desired step size to produce the desired stitching (e.g., connecting of adjacent elements of features on object 112) and overlap for leading and trailing SLMs 104. By way of example, support device 502 can have dimensions of 250 mm×250 mm (12 in×12 in) or 300 mm×300 mm (10 in×10 in). Support device 502 can be used for thermal management based on being manufactured from a temperature stable material.

Support device 502 can be utilized as a mechanical backbone to ensure spacing control of SLMs 104 and for embedding the circuitry and the thermal controls areas 504. Any electronics can be mounted on either or both of a backside and front side of support device 502. For example, when using analog based SLMs or electronics, wires can be coupled from control or coupling systems 504 to active areas 300. Based on being mounted on support device 502, these wires can be relatively shorter, which reduces attenuation of analog signals compared to a case where the circuitry is remote from the support device 502. Also, having short links between the circuitry and active areas 300 can increase communication speed, and thus increase pattern readjustment speed in real time.

Alternatively, when SLM 104 or electrical devices in the circuitry wear out, assembly 500 can easily be replaced. Although it would appear replacing assembly 500 is more costly than just a chip on assembly 500, it is in fact easier and quicker to replace the entire assembly 500, which can save production costs. Also, assembly 500 can be refurbished, allowing for a reduction in replacement parts if end users are willing to use refurbished assemblies 500. Once assembly 500 is replaced, only verification of the overall alignment is needed before resuming fabrication. In some examples, kinematic mounting techniques can be used to allow for repeatable mechanical alignments of assembly 500 during field replacements. This may eliminate a need for any optical adjustment of assembly 500.

Figure 6:
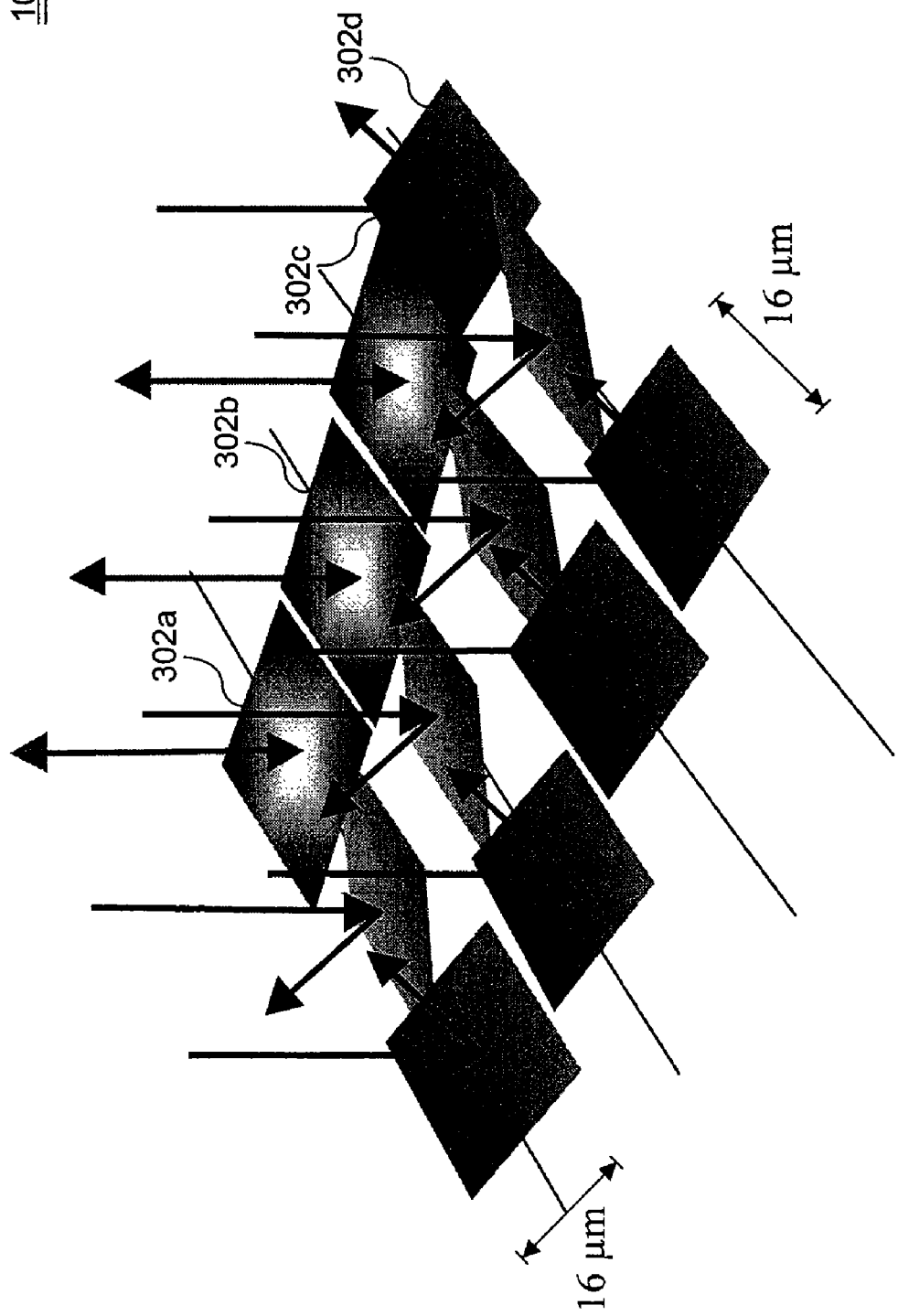
FIG. 6 illustrates a portion of a reflective SLM according to one embodiment of the present invention.

Current SLM systems typically utilize 16 μm×16 μm pixels 302 (see FIG. 6), with next generation SLM systems moving to 8×8 μm pixels 302. A typical SLM 104 contains over a million pixels 302, wherein the properties of each pixel 302 are individually controlled by a voltage applied individually to each pixel 302. Note that SLM 104 can be both reflective and transmissive (for example, mirror type reflective SLMs, and LCD type transmissive SLMs). Reflective SLMs 104 are more commonly used in the industry today. FIG. 6 is an illustration of such a reflective, or tilting, type SLM 104, showing twelve pixels (of which 302a-302d are labeled). In one example, a capacitive coupling (not shown) is controlled using a transistor (not shown). A typical pixel 302 is controlled in a fashion similar to how parallel plates in a capacitor are controlled, in other words, a capacitive coupling is used to control the tilt of the mirrors of the pixels 302 using electrostatic forces. In FIG. 6, one of the mirrors (mirror of pixel 302d), is shown as tilted when the capacitor under that mirror is charged.

If the pixel 302 is a square, its diffraction pattern is a sinc function, defined by $$\frac{\sin(\pi x)}{\pi x},$$

with a large zeroth order lobe, and smaller side lobes. When a pixel 302 is tilted, the diffraction pattern from the pixel 302 shifts an angular space to the side.

If the projection optics 110 only captures a portion of the zeroth order lobe, for example, ½ or ⅓ of the total amount of energy in the zeroth order lobe (i.e., using the PO 110 that leaves an individual SLM pixel un-resolved), then tilting the pixel 302d modulates the amount of light passing through the projection optics 110. Thus, it is essential for the modulation mechanism that the pixel 302d not be resolved, in order to have a modulation effect. However, because the pixel 302d is not resolved, instead of seeing a "sharp square" (for a square pixel or mirror), a "blob" of light (see FIG. 8, discussed below) will be imaged, and will exceed the nominal dimensions of the "sharp square" by several times. Thus, images from neighboring pixels 302 will overlap. The neighboring pixels 302 therefore will strongly interact with each other. This means that at each point in the image plane, light is received from several pixels 302.

Figure 7:
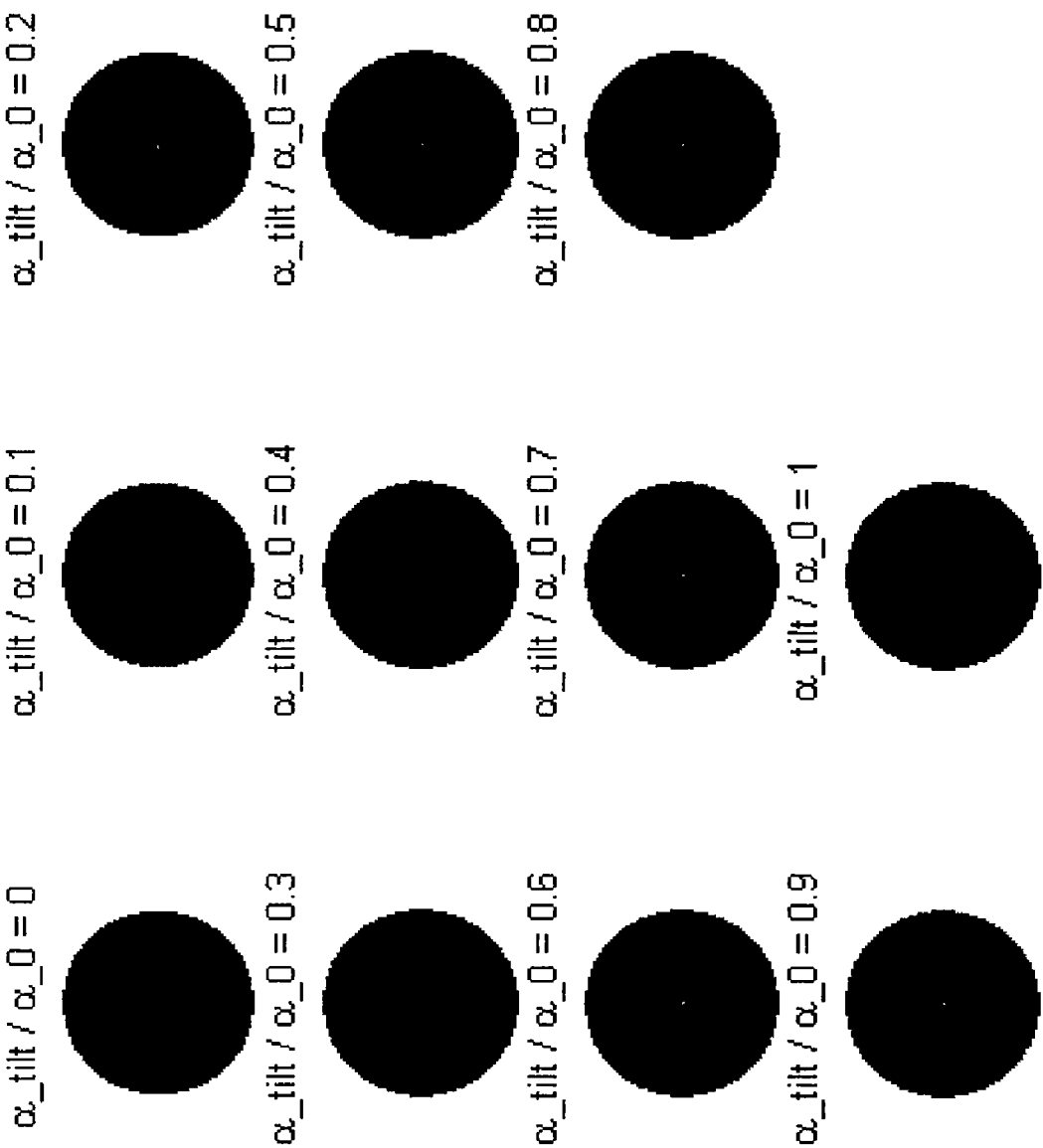
FIG. 7 illustrates a field in a pupil of the projection optics for ten different tilt values for a small numerical aperture projection optics.
Figure 8:
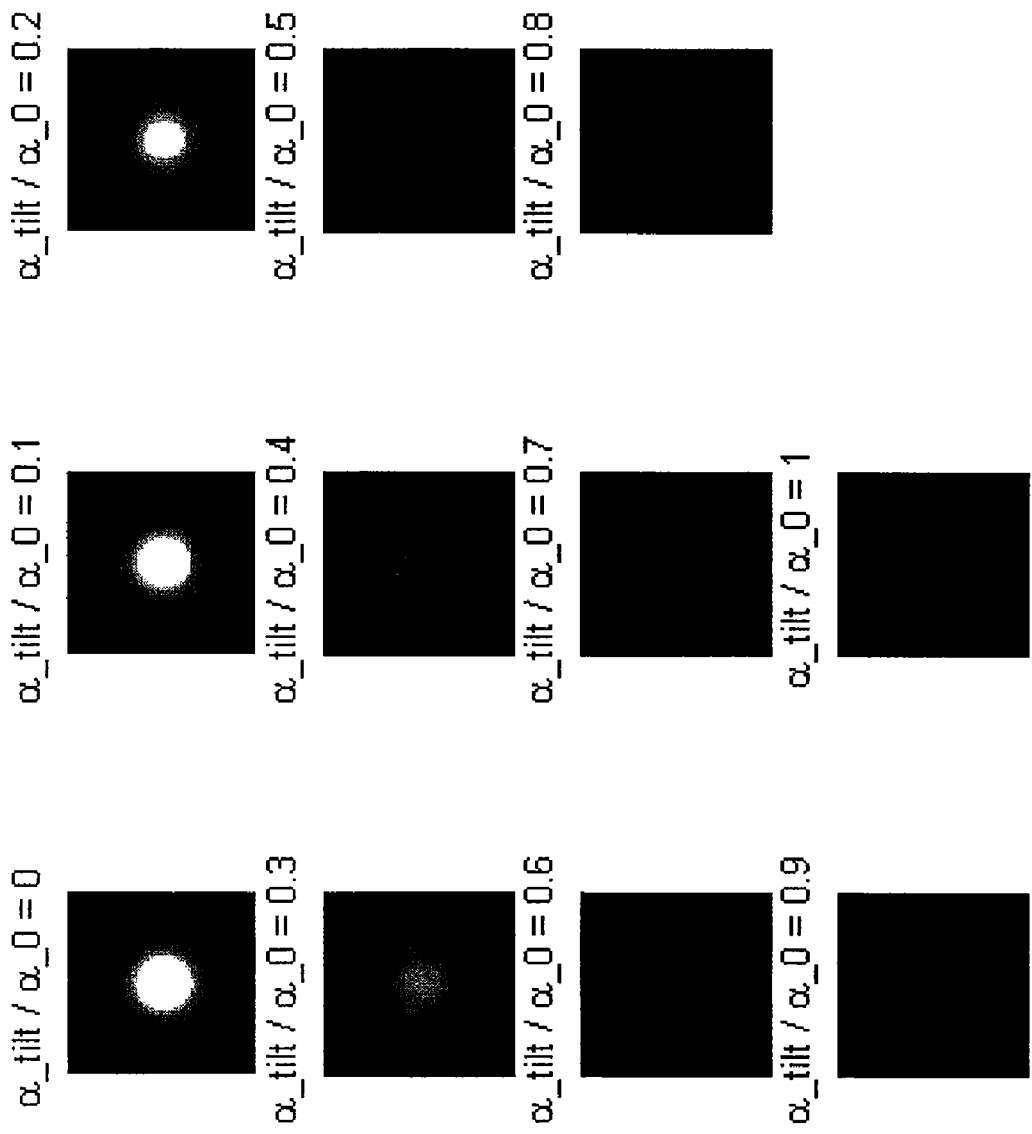
FIG. 8 illustrates a field in the projection optics image plane that corresponds to FIG. 7.

For the example illustrated in FIGS. 7-8, λ (source wavelength)=193.375 nm, L (pixel dimension)=16 μm, NA (numerical aperture) of the PO=0.00265, the pixel 302 tilts between $$\alpha = 0 \text{ and } \alpha = \alpha_0 = \frac{\lambda}{2*L}.$$

FIG. 7 illustrates the field in the pupil of the projection optics 110 for ten different tilt angles for a single pixel (note that in FIGS. 7 and 8 angular modulation of only one pixel is illustrated for clarity). With a numerical aperture of 0.00265, the SLM pixel is very poorly resolved (i.e., sub-resolved) in the image plane (see FIG. 8). Specifically, as shown in FIG. 8, although there is good modulation for the different tilt angles α, the image of the pixel 302 is very "spread out."

As noted above, there are a number of physical principles that can be used to modulate the light using an SLM. One of the principles is the use of graytone, or transmissive SLMs where the intensity of the transmitted light through each pixel is modulated. Another principle is the tilting mirror principle, or tilting SLMs, where the angle of each pixels mirror is controlled, usually digitally. A third type of principle for modulating SLM output is the use of pistoning, or moving mirrors, which introduce phase variation into the reflected wave front.

In the context of SLMs, rasterization is the process of, given the desired output, and given the properties of the illumination source and the SLM, calculating the optimum modulation parameters of the SLM pixels. Calculation of the aerial image is an essential step in virtually any rasterization algorithm. In order to rasterize, the aerial image needs to be computed iteratively many times.

Thus, the problem of interest may be defined as follows: it is desired to achieve a certain intensity distribution I($\underline{x},\underline{\alpha}$) in the image plane, which is also known as an "aerial image." A goal is to determine the set of pixel modification (modulation) parameters that will produce the desired aerial image. Generally, calculation of I($\underline{x},\underline{\alpha}$) for a general pattern of pixel modulation parameters $\underline{\alpha}=[\alpha_1, \ldots, \alpha_N]$, and where $\underline{x}$ is the position vector in the image plane, requires simulation of an aerial image, which is a computationally intensive task.

The aerial image from each pixel in response to a given set of modulation conditions $\underline{\alpha} = [\alpha_1, \ldots, \alpha_N]$ is known, either through a relatively straightforward calculation or through measurement. Knowing the amplitude and phase distribution at the object plane (i.e., at the SLM), it is possible, using a single Fourier transform to calculate the amplitude and phase distribution $U^{(p)}$ of the illumination field at the pupil of the projection optics 110, and then, using a second Fourier transform (or a more complex imaging model), to calculate the amplitude and phase distribution $U^{(i)}$ at the image plane. From that, the intensity distribution at the image plane can then be calculated.

More generally, the field $U^{(i)}$ in the best focus image plane and the field $U^{(p)}$ in the pupil plane are related by a linear operator F, that is, the "imaging model" used:

$$U^{(i)}(\underline{x},\underline{\alpha},\underline{f}_s) = F(U^{(p)}(\underline{f}_p,\underline{\alpha},\underline{f}_s)) \qquad \text{(Eq. 1)}$$

where $\underline{x}$ is a position vector in two dimensions in the image plane, i.e., (x, y). The vector $\underline{\alpha} = [\alpha_1, \ldots, \alpha_N]$, as noted above, is the set of all modulation of parameters of all the pixels of the SLM array. In a "low NA, scalar model," F is a Fourier transform from $\underline{f}_p$ independent variable (i.e., position in the pupil plane) to $\underline{x}$ (position in the image plane). Here, $\underline{f}_p = [f_p^{(x)}, f_p^{(y)}]$ are the pupil position coordinates, $$f_p^{(x|y)} = \frac{x|y}{\lambda R}$$

(where x/R and y/R represent the directional cosines corresponding to the angular coordinates in the pupil) and $\underline{f}_s = [f_p^{(x)}, f_p^{(y)}]$ is the source position coordinates from which the plane wave originates. The bold underline font indicates vector quantities.

The field $U^{(i)}$ in the image plane generated by a generic single pixel j (e.g. a tilting mirror pixel) that is illuminated by the plane wave originating at the point $f_s$ in the extended source S is given by:

$$U_j^{(i)}(\underline{x}) = U_j^{(i)}(\underline{x} - \underline{x}_j, \alpha_j, \underline{f}_s) \qquad \text{(Eq. 2)}$$

The aerial image $I(\underline{x},\underline{\alpha})$ resulting from such multiple pixels in an SLM array is given by:

$$I(x, \underline{a}) = \int_{source} \left| \sum_{j=1}^{N} U_j^{(i)}(x - x_j, \alpha_j, \underline{f}_s) \right|^2 d\underline{f}_s \qquad \text{(Eq. 3)}$$

where N is the total number of pixels. In the case of $U^{(i)}$, the field $U^{(i)}$ at any position in the image plane (i.e., at $\underline{x}_j$) depends on the tilting angle $\alpha_j$ and the location of the point source from which the plane wave originates at the source, or $\underline{f}_s$. Although, the above equation is based on the assumption that the source is binary (i.e., the intensity of all radiating points in the source is the same), this and the following equations can be easily re-formulated for the source that has a generic variation of intensity across it.

However, this mathematically straightforward procedure is extremely computationally intensive, since a typical SLM can have millions of pixels, each of which can have a large number of a possible modulation states (for example, 64 possible states for each pixel). More importantly, performing the straightforward calculation according to Eq. 3 would require performing an integration over the source in order to compute the aerial image resulting from the given modulation states $\underline{\alpha} = [\alpha_1, \ldots, \alpha_N]$ of the SLM pixels. The time that it takes to finish this computational task depends on the processing hardware involved, but may take anywhere from minutes to hours, depending on processor speed, I/O interface limitations, number of pixels, etc.

The process of calculating an aerial image for a tilting mirror type SLM will be described next in generic terms. A typical tilting mirror SLM has millions of mirrors, each of which is approximately square with the side dimension L, and each of which has a tilting angle $\alpha$ (modulation parameter). The SLM is positioned in the object plane. Thus, with a plane incoming wave, each mirror generates a reflection such that across each mirror, there is a linear variation of phase (because the mirror is tilted). In other words, the tilt of the mirror introduces a linear phase variation across each mirror into the reflected field. Thus, the entire SLM, located at the object plane, consists of multiple reflectors that generate a reflection with a constant amplitude but with varying phase.

If the mirrors are ideal, the variation of phase will be perfectly linear across each mirror, although in practice the mirrors may be less than perfect, introducing some aberrations into the reflected wavefront. The coefficient of linear variation varies from mirror to mirror, because the tilt angle of the mirrors is different. Also, it will be appreciated that even though the phase varies linearly across the pixel, the phase in the reflected wavefront "jumps" between adjacent pixels. At the center of the pixel, the phase is normally zero. Thus, with this analysis, the SLM may be alternatively viewed as a flat reflecting mirror that generates a constant amplitude reflecting wavefront with phase variation across the reflected wavefront.

The phase and amplitude distribution across the object (i.e., across the SLM) is mathematically "sampled" at various points using an imaginary grid that covers the SLM (typically at several grid points per mirror). The grid is such that each pixel has several "nodes" on it, e.g., ten nodes per pixel, where the reflected field is "sampled." Thus, if the reflected wavefront were "sampled" only at the points of the imaginary grid, the amplitude everywhere would be constant, while the phase would vary—and vary linearly on each mirror. The sampled wavefront can be represented by a matrix, or an array, where each (element) point is a complex number having an amplitude of 1 and a phase that is a function of the tilt angle $\alpha$ of the mirror. This array corresponds to the lithographic pattern, or, equivalently, to a representation of the pattern. This pattern can then be used by an algorithm that calculates the aerial image.

In conventional algorithms, as noted above, the aerial image is calculated using two Fourier transformations (object plane to pupil plane, and then pupil plane to image plane). More involved calculation may be needed instead of the second Fourier transformation in case of a high NA. The conventional calculation is relatively time consuming, even if Fast Fourier transform (FFT) algorithms are used. After computing the two Fourier transforms, the intensity in the image plane can be computed by squaring the field in the image plane. Furthermore, the above calculation needs to be repeated for every point in the extended source that generates a plane wave incident on the object at a certain angle. The "partial" aerial images resulting from every point in the extended source need to be summed (integrated over the source) to arrive to the image resulting from the given illumination mode. Because the "mask" (pattern) is treated as a generalized object, the calculation described above is extremely computationally intensive if done in a brute force manner.

The present approach is based on the insight that the object, or pattern, is not an arbitrary (generalized) pattern, but has a well-defined relationship between areas of the object that itself consists of repeating shapes. In this case, the repeating shapes are square pixels that are repeated many times across the surface of the object. Also, the integration over the extended source can be pre-computed in advance. This insight shows that the brute force calculation performed conventionally is excessive. This will be appreciated using a simplified example of an SLM that consists of graytone pixels, rather than tilting mirrors.

In the graytone example, the pixels all have the same phase of the transmitted field, but varying intensity transmittance or reflectivity. Taking a single graytone pixel, the image field from that pixel depends linearly on the modulation of its amplitude transmittance. Thus, the image field $U^{(i)}$ of a 50% transmissive graytone pixel is exactly half of the image field of a 100% transmissive graytone pixel in amplitude, but is identical in every other way to the 50% transmittance case. The graytone pixel and the projection optics 110 effectively operate linearly (in the mathematical sense) on the incoming light. Because the imaging of the SLM is normally done in a subresolution mode, the image of the pixel is actually a "blob", illustrated in FIG. 8, discussed above. The "blob," is approximately circular. When the transmittance of the pixel is modulated, the intensity of the "blob" is modulated linearly with the pixel modulation. The distribution of light in the "blob," however, remains the same.

The above property, accurate for the SLMs with pixels with varying amplitude transmittance/reflectivity, can be generalized to pixels with more complex modulation principles through graytone approximation. The graytone approximation, which is a good approximation for sub-resolution pixels, is given by:

$$U_j^{(i)}(\underline{x}-\underline{x}_j,\alpha_j,\underline{f}_s) = g(\alpha_j) U^{(i)}(\underline{x}-\underline{x}_j,\underline{f}_s) \quad \text{(Eq. 4)}$$

where $|g(\alpha_j)| \leq 1$ is the pixel's effective amplitude graytone and $\alpha_j$ is the modulation parameter (in the case of the graytone-type SLM, transmission value). Several approaches are possible for deriving the amplitude graytone dependence on the modulation parameter $\alpha$. For instance, for tilting mirror pixels, one relatively accurate model is $g(\alpha) = \text{sinc}(\alpha/\alpha_0)$, $$\alpha_0 = \frac{\lambda}{2 * L_{pixel}}.$$

Note that pixel-to-pixel variations are also neglected in Equation 4 (i.e., $U^{(i)}$ instead of $U^{(i)}_j$).

As may be seen from Equation 4, the graytone approximation for a single pixel, which is a function of position $\underline{x}$, tilt angle $\alpha$, and the source position vector $\underline{f}_s$, may be represented as a product of two separate functions. The first function is an effective graytone of a tilting mirror pixel, which may be represented by a sinc function. The second part is a function of only the position in the image plane and properties of the source. Using the sinc function approximation results in a "blob" of light in the image plane, which scales linearly with the value of g. The parameter g is therefore the "effective" graytone that depends on the tilt angle $\alpha$. Thus, Equation 4 essentially says that the image plane field $U^{(i)}$ scales linearly—not with the tilt angle $\alpha$, but with a function of the tilt angle $\alpha$.

By substituting the Equation 4 into Equation 3, the result for intensity in the image plane becomes the following:

$$I(\underline{x},\underline{g}) = \sum_{j1,j2=1}^{N} g_{j1} g_{j2} C_{j1,j2}(\underline{x}) \quad \text{(Eq. 5)}$$

where $\underline{g}=[g_1, \ldots, g_N]$ are the pixel graytones (i.e., for every tilt $\alpha_j$, the vector $\underline{g}$ represents the associated graytone for that tilt $\alpha_j$), $g_j$ is the effective graytone corresponding to the tilt angle $\alpha_j$, N is the number of pixels, and $C_{j1,j2}(\underline{x})$ is a pixel interference matrix (PIM), defined as follows:

$$C_{j1,j2}(\underline{x}) = \int_{source} U^{(i)*}(\underline{x}-\underline{x}_{j1},\underline{f}_s) U^{(i)}(\underline{x}-\underline{x}_{j2},\underline{f}_s) d\underline{f}_s \quad \text{(Eq. 6)}$$

The pixel interference matrix C characterizes pair-wise interference between pixels for a given illumination mode, and its entries can be pre-computed, either from a small number of aerial image simulations or analytically. It is also sufficient to retain only those entries in pixel interference matrix C that correspond to the pixels in proximity to each other (i.e., neighbors). The pixel interference matrix C entries depend only on the relative position of two pixels with regard to each other (up to a rotation). In other words, in the graytone case, in order to account for the nearest neighbors, the pixel interference matrix C needs only two essential entries: the ones describing the interference between the current pixel and its "northern" and "north-eastern" neighbors (all other entries are just rotations of one of these two, and north and north-eastern are used as examples).

These equations show that intensity in the image plane is a function of position ($\underline{x}$) and the $\underline{g}$ vector, where the $\underline{g}$ vector represents the tilt angle information (not to be confused with the tilt angles themselves). Equivalently, intensity $I(\underline{x},\underline{\alpha})$ is a quadratic function of the graytone vector $\underline{g}$.

Note also that in Equation 6, the matrix C does not depend on the modulation state of the pixels, since the pixel modulation state is separated out into the $g_{j1}$, $g_{j2}$ part of Equation 5. In other words, the matrix C depends only on the position variables in the image plane and in the plane of the source (variables $\underline{x}$ and $\underline{f}_s$). This is another way of saying that the C matrix depends on the locations of the pixels and the "shape" of the illumination source. That means that the C matrix can be pre-computed. Then, knowing C, and knowing the state of the pixels, the quadratic expression of Equation 5 can be computed in a relatively straightforward manner. Note that Equation 5 does not require any complex real-time re-calculation that uses Fourier transforms. This part can be done a priori, when C is computed, and it only needs to be done once. Phrased another way, the aerial image calculation is done once, and then can be reused in real time. Phrased another way, the aerial image calculation is done once, and then can be reused in real time.

Additionally, in the rasterization process, it is often desirable to compute not only the aerial image $I(\underline{x},\underline{\alpha})$, but also the sensitivity of the aerial image $I(\underline{x},\underline{\alpha})$ to changes in pixel modulation $\underline{\alpha}$. In other words, if the modulation state $\alpha_j$ of one pixel is changed slightly, what will be the state of the aerial image? This is generally known as "sensitivity analysis" during the rasterization process. Sensitivity is usually calculated using a derivative of the aerial image. Performing the iterative rasterization calculation in real time requires very rapid calculation of the aerial image at least in the vicinity of a particular pixel. Conventional approaches, as applied to SLM rasterizations in real time, are impractical. The approach described herein breaks the process down into several steps. Some of the steps involve a pre-calculation of some of the parameters, thus required only a relatively small amount of calculation in real time.

In the framework of graytone approximation, the aerial image sensitivity to the graytones can be computed in real time from the known pixel interference matrix C, based on the following equation:

$$\frac{\partial I(x, g^{(0)})}{\partial g_{j1}} = \sum_{j2=1}^{N} g_{j2}^{(0)} (C_{j1,j2}(x) + C_{j2,j1}(x)) \quad \text{(Eq. 7)}$$

Equation 7 above shows the sensitivity of the image to pixel modulation parameters, which is represented by a derivative of the intensity with respect to the function g. Equation 7 shows what happens to the aerial image if a state of single pixel is changed slightly. Equation 7 is used by the rasterization process in order to iteratively converge on the optimal solution. Note that the sensitivity given by Equation 7 is also linear with the C matrix and the vector g, and also does not require any continuous re-calculations of Fourier transforms.

Thus, with the assumption that a tilting mirror pixel can be approximated using the graytone model, the calculation of the aerial image I(x,α) can be performed very rapidly, using a pre-computed pixel interference matrix C, and the functions g, which are derived from the pixel tilting angles for each pixel. Note also that C is a matrix of functions, not merely a matrix of numbers (although in the degenerate case, it can reduce to a matrix of numbers). The matrix $C_{j1,j2}(x)$, as noted above, characterizes the interference between the pixels j1 and j2. The entries on the diagonal of the matrix C represent the interference of the pixel with itself, or the aerial image of the pixel itself. The off-diagonal elements of the matrix C represent interference between two different pixels (i.e., pair-wise interference). This pair-wise interference is independent of the state of the modulation of the pixels.

With the above discussion in mind, in order to compute the aerial image I(x,α) from the entire SLM array, it is clear that in the case of a graytone SLM, there is no need to do the computationally intensive process of two Fourier transforms. All that needs to be done is simply to determine an image from a single graytone pixel at 100% transmittance, and then linearly scaling that image and offsetting the image of the individual pixel in the x and y direction in the image plane, with the appropriate scale factor, for each corresponding pixel. In other words, the computationally intensive problem of two Fourier transforms plus the intensity calculation (a squaring of the image field distribution $U^{(i)}$) can be reduced to a relatively straightforward calculation of scaling and addition.

Furthermore, pixels that are relatively far away from each other interact very weakly, if at all, with each other in the image plane. To calculate the field $U^{(i)}$ at a particular point in the image plane, one only needs to know the intensity distribution from one pixel and a few of its neighbors. In other words, in the case of a graytone SLM, it is clear how dramatic reduction in the number of calculations can be achieved. In this approach, the aerial image calculation only needs to be done for a single pixel, not for the entire SLM array, and then the pixel can be "replicated" across the image plane and combined to form the overall aerial image.

The above example of the graytone approximation relies on two simplifications, or approximations. The first simplification is exactly that—the use of a graytone array. Most commercial applications (though not all) use tilting mirrors. Tilting mirror pixel intensity distribution does not scale linearly with α in the image plane, unlike graytone pixel intensity distribution.

The second simplification is that the object is illuminated by a coherent light source. In other words, the illumination light source consists of a single point source (pulsed or continuous wave). In reality, this is rarely the case. Most practical illumination sources used in microlithography equipment have much more complex intensity distributions, for example, dipole, or quadrupole sources. These sources can in effect consist of multiple "point" sources that are not coherent relative to each other. The above discussion only addresses the problem of using a partially coherent source.

A more accurate graytone approximation is needed, which would allow a fast calculation of the aerial image and its sensitivities for various illumination conditions. In the case of a tilting mirror, the shape of the intensity distribution in the image plane changes, depending on the tilt angle α. The key difficulty, as noted above, is that the change in the intensity distribution is not linear with the tilt angle α, unlike the change in intensity distribution as a function of transmittance in the case of a graytone pixel. Thus, an approach relying on simple linear scaling will rarely work accurately. Here, both $U^{(i)}$ amplitude and phase have a non-linear dependence on the tilt angle α.

However, in the case of a subresolution projection system, tilting mirror pixels can be approximated using the graytone approach. With that approximation, which is discussed below, and with the issue of an incoherent extended source also addressed, the present invention provides a method for simplifying the calculation of the aerial image from a tilting mirror SLM.

Another way to approach the tilting mirror problem is to treat the tilting mirror pixels as graytone pixels, with the difference between graytone pixel behavior and tilting mirror behavior addressed as a next order correction in the approximation.

The graytone approximation, as shown above, can be thought of as an approximation based on replacing the variation of the field $U^{(p)}$ in the PO 110 pupil from a modulated tilted mirror pixel by a (nearly) constant. The next step is to account for a linear (first order) variation of the field in the pupil $U^{(p)}$. This will lead to a more accurate PIM and the aerial image that take into account the phase variation across the image plane field $U^{(p)}$ from a tilted mirror pixel.

Yet another step is to represent the field in the pupil $U^{(p)}$ as a sum of a number of basis functions (e.g., a constant, a linear, quadratic etc.). This will lead to a more general and more accurate approximation, and is faster to compute.

Figure 9:
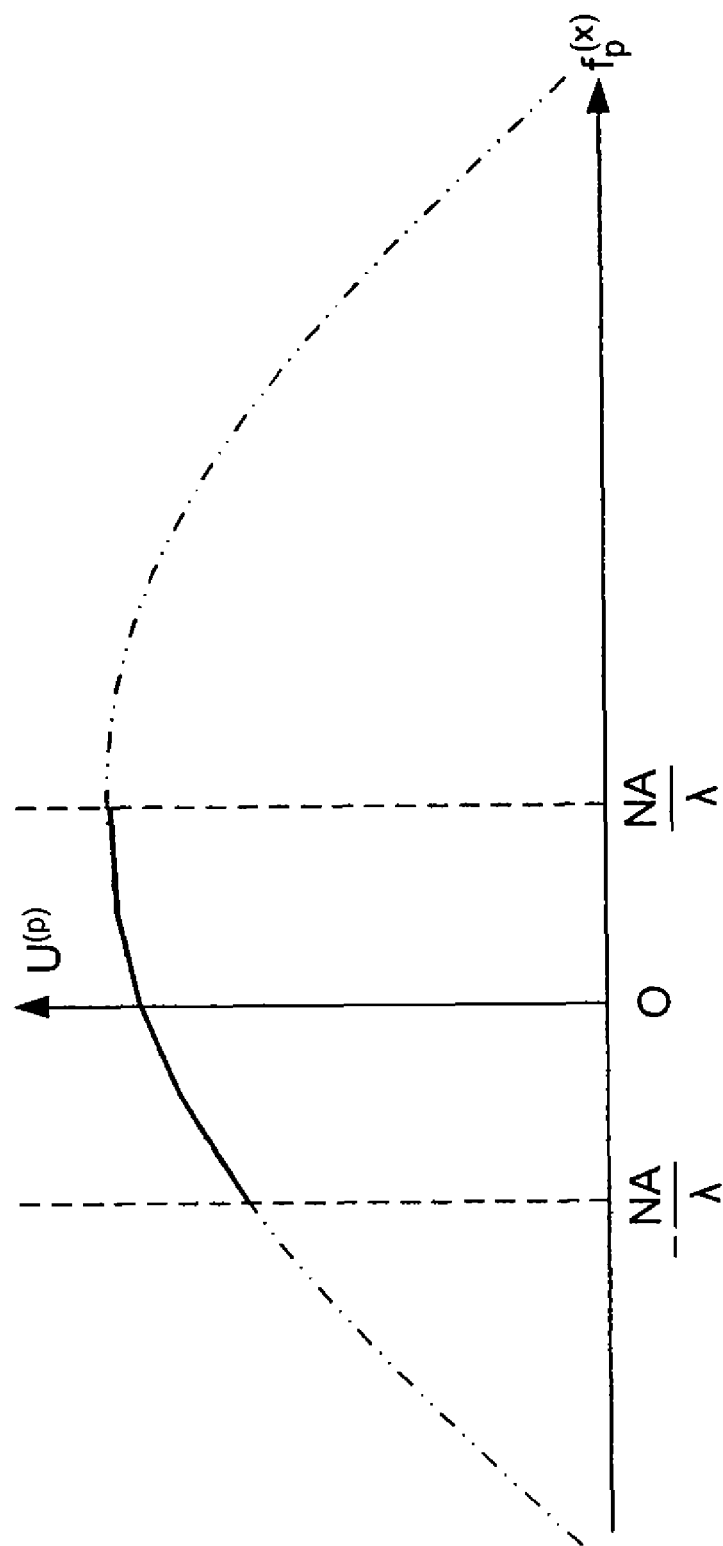
FIG. 9 shows an approximation of a tilting mirror pixel field according to one embodiment of the present invention.

FIG. 9 illustrates the field in the pupil $U^{(p)}$ from a single tilting mirror pixel. The curve shown in FIG. 9 is essentially the zero order lobe of a sinc function. The solid portion of the curve is the part that is "sampled" by the numerical aperture of the pupil of the projection optics 110. In other words, the zero order lobe of the sinc function is much wider than the entrance numerical aperture of the pupil, and only a small portion of the lobe is actually captured by the entrance pupil of the projection optics 110 in a sub-resolution system.

In this case, the solid portion of the graph of the curve in FIG. 9 can be reasonably well approximated by a simpler function (compared to a sinc function). For example, it may be approximated by a straight line, or by a quadratic equation. The overall curve in FIG. 9 shifts to the left and to the right, depending on the tilt angle α of the mirror. If the mirror is not tilted, the maximum of the curve will exactly coincide with the center of the pupil. If the pixel with the intensity curve as shown in FIG. 9 graytones, the curve in FIG. 9 moves up and down (or scales in intensity). The zeroth order approximation of the portion of the sinc function (shown as a solid portion of the curve in FIG. 9) is a horizontal line. A first order of approximation is a straight line with a slope, with the equation $a_0+a_1x$. A quadratic approximation is an equation in the form $a_0+a_1x+a_2x^2$.

Thus, one should consider: how well does the graytone model approximate the tilting mirror "reality" for a sub-resolution system. In other words, if only a small portion of the light from the pixel is actually captured by the pupil of the projection optics 110, then the approximation discussed above is a reasonably good approximation. It is believed that the first order approximation (in other words, approximating the field pupil $U_j^{(p)}$ for each pixel j using a straight line with a slope) should be a reasonably good approximation. Note also that although polynomial approximations can be used, the invention is not limited to the use of polynomial functions as basis functions, but any number of functions may be used. However, since it is desirable to avoid having to calculate computationally intensive functions, such as sinc functions, the use of straight line or quadratic approximations is believed to be advantageous.

Here, the coefficients $a_0, a_1 \ldots$ depend on the tilt angle α. Thus, the modulation of the pixels is expressed as the coefficients $[a_0, a_1 \ldots]$. $\underline{f}_p$ is the variable representing distance across the pupil, and is a two dimensional variable. Thus, as may be seen in Equations 8 and 9 below, the dependence of the aerial image on the modulation parameters can once again be separated out in the equations, and the equations themselves simplified for rapid calculation. Note that in the equations, because there are two position variables (in other words, the distance in the pupil plane $\underline{f}_p$ is a vector in two dimensions), and because the orientation of each pixel can be controlled in two dimensions, the C matrix for this case becomes in effect a "four dimensional" matrix, where each entry in the matrix C is defined by four indices $j_1, j_2, k_1$ and $k_2$.

The coefficients $[a_0, a_1, \ldots]$ are pre-calculated, or otherwise determined prior to the exposure process. Note that the dependence of the coefficients $a_k$ can be analytically determined. With all that information, the matrix C can then be calculated.

Note also that, as before, the interaction of pixels that are far away from each other is relatively small, and, for each pixel, other than its few neighboring pixels, the interaction with the other remaining pixels is virtually nonexistent. Therefore, most entries in the matrix C can actually be approximated by zero entries. This permits further improvement in the speed of the calculation of the aerial image.

Thus, with the above discussion, it is possible to calculate the field $U^{(p)}$ at the pupil plane, and, in the process, split the dependence of the intensity I on modulation parameters α from the dependence on the pupil coordinate $\underline{f}_p$ and the source coordinate $\underline{f}_s$. This will be convenient for the computation of the elements of the matrix C. In the case of the four-dimensional matrix C, each element is calculated as described below. Consider a generalized grayscale approximation:

$$U^{(i)}(\underline{x}, \underline{a}, \underline{f}_s) = \sum_{j=1}^{N} \sum_{k=1}^{n} a_k(\alpha_j) U^{(k)}(\underline{x} - \underline{x}_j, \underline{f}_s) \quad \text{(Eq. 8)}$$

where $U^{(k)}(\underline{x},\underline{f}_s)=F(P_k(\underline{f}_p,\underline{f}_s))$ (Eq. 9)

and n is the number of basis functions. The resulting aerial image can then be written as $$I(\underline{x}, \underline{a}) = \int_{source} |U^{(i)}(\underline{x}, \underline{a}, \underline{f}_s)|^2 d\underline{f}_s = \quad \text{(Eq. 10)}$$

$$\sum_{j1,j2=1}^{N} \sum_{k1,k2=1}^{n} a_{k1}^*(\alpha_{j1}) a_{k2}(\alpha_{j2}) C_{j1j2k1k2}(\underline{x})$$

where $C_{j1j2k1k2}(\underline{x}) =$ (Eq. 11)

$$\int_{source} U_{j1}^{(k1)}(\underline{x}-\underline{x}_{j1}, \underline{f}_s) U_{j2}^{(k2)}(\underline{x}-\underline{x}_{j2}, \underline{f}_s) d\underline{f}_s$$

is the four dimensional pixel interference matrix C for the given illumination mode (i.e., for a given "source"). The above expression for the aerial image allows to quickly compute the aerial image and its derivatives from the pre-computed PIM coefficients $C_{j1j2k1k2}(\underline{x})$.

Consider the following graytone approximate proper, as per Equation 4:

$$U_j^{(i)}(\underline{x}-\underline{x}_j,\alpha_j,\underline{f}_s)=g(\alpha_j)U^{(i)}(\underline{x}-\underline{x}_j,\underline{f}_s) \quad \text{(Eq. 4)}$$

where $U^{(i)}(\underline{x}-\underline{x}_j,\underline{f}_s)$ is an image field of a pixel, and $g(\alpha_j)$ is a graytone. For tilting mirror pixels, this approximation captures variations of the amplitude of the modulated pixel image, but it does not capture the variation of phase in the modulated pixel image. Let $P_k(\underline{f}_p, \underline{f}_s)$ represent known basis functions to represent the variation of the pupil field $U^{(p)}$. This approximation corresponds to n=1 and $P_1(\underline{f}_p,\underline{f}_s)$ being a constant (on a slowly varying even function) of $\underline{f}_p$.

Next, consider a refined graytone approximate taking into account a linear variation of the field across the pupil. For a tilting mirror pixel:

$n=2 P_1(\underline{f}_p,\underline{f}_s)=P_1(\underline{f}_s)$-constant term in pupil variation $P_2(\underline{f}_p,\underline{f}_s)=f_p^{(x)} \cdot P_1(\underline{f}_s)$-linear term in pupil variation Contrast (even) variation across the pupil in $P_1$ will account for an amplitude modulation in the image plane. Linear (odd) variation in $P_2$ will account for the phase variation in the image plane.

However, it is not the field in the pupil plane $U^{(p)}$ that is of ultimate interest, but rather the field in the image plane $U^{(i)}$, or more specifically, the intensity distribution $I(\underline{x},\underline{\alpha})$ in the image plane. To calculate the intensity distribution, Equation 10 is used, as discussed above. Thus, Equation 10 may be thought of as a transformation of the pupil plane field $U^{(p)}$ into an image plane intensity $I(\underline{x},\underline{\alpha})$. Note that in Equation 12 below:

$$U^{(i)}(\underline{x}, \underline{a}, \underline{f}_s) = \sum_{j=1}^{N} \sum_{k=1}^{n} a_k(\alpha_j) U^{(i)}(\underline{x} - \underline{x}_j, \underline{f}_s) \quad \text{(Eq. 12)}$$

-continued $$\text{where } U^{(k)}(\underline{x}, \underline{f}_s) = F(P_k(\underline{f}_p, \underline{f}_s)) \quad \text{(Eq. 13)}$$

F is a linear operator, which, for example, may be a Fourier transform. As discussed above, the matrix C does not depend on the modulation parameters $\underline{\alpha}$, but only on the position variable. The modulation parameter dependence has been separated out into the functions $a_{k1}$, $a_{k2}$. C can be pre-computed using, for example, an aerial image simulation. This may be thought of as an "extended graytone approximation." A number of techniques are known in the art for optimized handling of calculations involving matrices with mostly zero entries.

The advantage of the approach using the equations above is that most of the computational effort is in the calculation of the matrix C, and the matrix C is pre-computed, leaving only a relatively modest amount of calculation for real time processing.

The pupil field $U^{(p)}$ generated by the pixelized SLM in the PO 110 pupil is given by:

$$U^{(p)}(\underline{f}_p, \underline{a}, \underline{f}_s) = \sum_{j=1}^{N} U_j^{(p)}(\underline{f}_p, \underline{a}, \underline{f}_s), |\underline{f}_p| \leq \frac{NA}{\lambda} \quad \text{(Eq. 14)}$$

The approximation expressed in terms of $P_k(f_p, f_s)$ then becomes:

$$U_j^{(p)}(\underline{f}_p, \underline{a}, \underline{f}_s) = \sum_{k=1}^{n} a_k(\alpha_j) P_k(\underline{f}_p, \underline{f}_s) \quad \text{(Eq. 15)}$$

$a_k(\alpha_j)$ characterize the modulation process. An important particular case is n=1, $P_1$=sinc $L \cdot \underline{f}_s^x$—i.e., a grayscale approximation of the pixel—the field is constant within the pupil and varies only as a result of going from one point in the extended source to another.

This result can also be presented in its most general form as:

$$I(\underline{x},\underline{\alpha}) = \Im(\underline{\alpha}, C(\text{source},\underline{x}_j)) \quad \text{(Eq. 16)}$$

$$dI(\underline{x},\underline{\alpha}) = \Im_{\underline{\alpha}}^{-1}(\underline{\alpha},C(\text{source},\underline{x}_j))d\underline{\alpha} \quad \text{(Eq. 17)}$$

where C(source, $\underline{x}_j$) is the pixel interference matrix (which is pre-computed), and $\Im$ is a known function of its arguments that can be computed relatively fast.

FIG. 10 illustrates a process of calculating the aerial image in flow chart form. As shown in FIG. 10, the Pixel Interference Matrix is calculated based on position, modulation states and approximation functions (step 1002). The effective graytones are calculated (step 1004). The aerial image is then calculated (step 1006). Sensitivities are then calculated (step 1008). If the sensitivities and the aerial image are as desired (step 1010), the process terminates, otherwise, the calculation returns to step 1006.

Thus, the invention proposes a method and system to pre-compute the essential information about the interaction of aerial images from each pixel with aerial images of other pixels. This information does not depend on the states of the pixels $\underline{\alpha}$. It can be pre-computed using aerial image simulation and stored. With the help of this information, the aerial image I($\underline{x},\underline{\alpha}$) and its first and higher-order derivatives can be computed very rapidly.

Although the discussion above is primarily in terms of tilting micromirror-type SLMs, the invention is also applicable to other types of SLMs, such as SLMs utilizing pistoning or otherwise deformable micromirrors, GLVs, or SLMs utilizing transmissive (refractive) pixels based on other modulation principles.

An application of the present invention involves, for example, simulation of aerial images given certain SLM patterns, to see if the desired aerial images are achievable. Other applications include real time programming of the SLM. Yet other applications include projection devices, such as televisions, where rasterization is used. The invention is also applicable to any systems where images are projected using SLMs, such as projection televisions, movie projectors, etc.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A rasterization method for pixels of a spatial light modulator array, comprising:
   pre-computing optical interferences between pixels of the spatial light modulator array in a partial coherent illumination; and
   computing at least one of an aerial image and a derivative of the aerial image based on the pre-computed optical interferences, without performing a rasterization computaton that modifies pixel states of the pixels of the spatial light modulator array.

2. The method of claim 1, further comprising:
   determining pixel states of the pixels of the spatial light modulator array based on computed aerial image or computed derivative of the aerial image to render a lithographically printed pattern in a maskless lithography system.

3. The method of claim 1, wherein computing the at least one of the aerial image and the derivative of the aerial image comprises:
   pixelizing the spatial light modulator array and at least one derivative of the at least one aerial image with respect to pixel modulation parameters for calculating a partially coherent aerial image of the pixelized spatial light modulator array and the derivative of the aerial image with respect to the pixels states.

4. The method of claim 3, wherein pixelizing the spatial light modulator array and the at least one derivative of the at least one aerial image further comprises:
   determining entries of a Pixel Interference Matrix (PIM); and
   computing a quadratic function with known coefficients to compute the aerial image or the derivative of the aerial image in a vicinity of a given point based on the entries in the PIM corresponding to the pixels in a close proximity to the given point, wherein each entry of the PIM characterizes the optical interference between a respective pair of pixels.

5. The method of claim 1, wherein computing the at least one of the aerial image and the derivative of the aerial image comprises:
calculating pair-wise interference between the pixels of the spatial light modulator array.

6. The method of claim 5, wherein computing the at least one of the aerial image and the derivative of the aerial image further comprises:
calculating effective graytones corresponding to modulation states of the pixels.

7. The method of claim 6, wherein computing the at least one of the aerial image and the derivative of the aerial image further comprises:
calculating the at least one of the aerial image and the derivative of the aerial image based on the pair-wise interference and the effective graytones.

8. The method of claim 7, wherein the effective graytones depend only on the modulation states of the pixels.

9. The method of claim 7, wherein the pair-wise interference depends only on position variables.

10. The method of claim 9, wherein the position variables are position in an image plane and position in a plane of a source of electromagnetic radiation.

11. The method of claim 7, wherein the pair-wise interference is represented by a matrix of functions.

12. The method of claim 7, wherein the pair-wise interference is represented by a four dimensional matrix.

13. The method of claim 7, wherein the effective graytones are approximated using sinc functions.

14. The method of claim 7, wherein the effective graytones are approximated using polynomial functions.

15. A rasterization system for pixels of a spatial light modulator array, comprising:
means for pre-computing optical interferences between pixels of the spatial light modulator array in a partial coherent illumination; and
means for computing at least one of an aerial image and a derivative of the aerial image based on the pre-computed optical interferences, without performing a rasterization computation that modifies pixel states of the pixels of the spatial light modulator array.

16. The system of claim 15, further comprising:
means for determining pixel states of the pixels of the spatial light modulator array based on computed aerial image or computed derivative of the aerial image to render a lithographically printed pattern in a maskless lithography system.

17. The system of claim 15, wherein means for computing the at least one of the aerial image and the derivative of the aerial image comprises:
means for calculating pair-wise interference between the pixels of the spatial light modulator array;
means for calculating effective graytones corresponding to modulation states of the pixels; and
means for calculating the at least one of the aerial image and the at least one derivative based on the pair-wise interference and the effective graytones.

18. The system of claim 17, wherein the effective graytones depend only on the modulation states of the pixels.

19. The system of claim 17, wherein the pair-wise interference depends only on position variables.

20. The system of claim 17, wherein the pair-wise interference is represented by a matrix of functions in a four dimensional matrix, wherein the effective graytones are approximated using either sinc functions or polynomial functions.

* * * * *